(12) United States Patent  
Matsushita et al.

(10) Patent No.: US 7,114,551 B2
(45) Date of Patent: Oct. 3, 2006

(54) LIQUID COOLING MODULE

(75) Inventors: Shinji Matsushita, Chigasaki (JP); Hironori Oikawa, Hadano (JP)

(73) Assignee: Hitachi, Ltd., Tokyo (JP)

( * ) Notice: Subject to any disclaimer, the term of this patent is extended or adjusted under 35 U.S.C. 154(b) by 344 days.

(21) Appl. No.: 10/796,050

(22) Filed: Mar. 10, 2004

(65) Prior Publication Data

US 2005/0067145 A1   Mar. 31, 2005

(30) Foreign Application Priority Data

Sep. 25, 2003   (JP) ............................. 2003-332918

(51) Int. Cl.
*F28D 15/00* (2006.01)
*H05K 7/20* (2006.01)

(52) U.S. Cl. ................. 165/80.4; 165/104.33

(58) Field of Classification Search ............... 165/80.3, 165/80.4, 104.33, 110; 361/697, 698, 699, 361/702; 257/714
See application file for complete search history.

(56) References Cited

U.S. PATENT DOCUMENTS

| | | | |
|---|---|---|---|
| 5,203,399 A * | 4/1993 | Koizumi ................. | 165/104.33 |
| 5,323,847 A * | 6/1994 | Koizumi et al. ........ | 165/104.33 |
| 5,646,824 A | 7/1997 | Ohashi et al. | |
| 5,764,483 A * | 6/1998 | Ohashi et al. .............. | 361/699 |
| 6,166,907 A | 12/2000 | Chien | |
| 6,263,957 B1 * | 7/2001 | Chen et al. ................. | 165/80.4 |
| 6,360,816 B1 | 3/2002 | Wagner | |
| 6,600,649 B1 * | 7/2003 | Tsai et al. ................... | 361/697 |
| 6,668,911 B1 * | 12/2003 | Bingler ....................... | 165/80.4 |
| 6,763,880 B1 * | 7/2004 | Shih ........................ | 165/80.4 |
| 6,778,394 B1 * | 8/2004 | Oikawa et al. ............. | 361/700 |
| 6,840,304 B1 * | 1/2005 | Kobayashi et al. ......... | 165/11.1 |
| 6,926,070 B1 * | 8/2005 | Jenkins et al. ................ | 165/79 |

FOREIGN PATENT DOCUMENTS

| | | |
|---|---|---|
| JP | 06-266474 | 3/1993 |
| JP | 6-266474 | 9/1994 |
| JP | 10-294582 | 11/1998 |
| JP | 2001-223490 | 8/2001 |

\* cited by examiner

*Primary Examiner*—Tho Duong
(74) *Attorney, Agent, or Firm*—Mattingly, Stanger, Malur & Brundidge, P.C.

(57) ABSTRACT

A cooling module designed so that the following components are stacked above a CPU: a cooling jacket allowing a cooling liquid to absorb heat generated by the CPU, a pump causing the cooling liquid to circulate, a reserve tank used to provide a supplementary cooling liquid and to bleed air from the cooling liquid, and a first radiator that cools the cooling liquid, the cooling module being also designed so that a second radiator is located at a side of the first radiator to cool the cooling liquid, wherein the cooling liquid is driven by the pump so as to circulate from the cooling jacket, which absorbs heat generated by the CPU, through the radiators to the reserve tank.

5 Claims, 9 Drawing Sheets

LIQUID COOLING MODULE

CROSS REFERENCE TO RELATED APPLICATION

This application claims priority from Japanese Patent Application No. 2003-332918 filed on Sep. 25, 2003, the entirety of which is hereby incorporated by reference.

BACKGROUND OF THE INVENTION

The present invention relates to a cooling module, and in particular, to a cooling module that is suitable for mounting a plurality of CPUs with different heating values in a personal computer or the like.

PRIOR ART

Conventional information processing apparatuses such as personal computers employ a forced air cooling method of attaching a radiating fin to a CPU and attaching a cooling fan to the top of the radiating fan to air-cool the CPU.

The operating speed of CPUs used in information processing apparatuses such as personal computers has been steadily increasing. In the recent years, the thermal design power consumption of the CPUs has been close to 100 W. The cooling capability of the conventional forced air cooling is now insufficient deal with the increased power consumption of the CPU.

As a technique to cool the CPU, which has increased power consumption, water cooling is actually used for some personal computers. With the water cooling technique, a cooling jacket and a radiator are connected together using a pipe through which a cooling liquid circulates. The cooling jacket is attached to the CPU to allow the cooling liquid to absorb heat generated by the CPU. The radiator then causes the cooling liquid to radiate the heat. JP-A-6-266474 discloses an example of such a water cooling technique.

Furthermore, for the above forced air cooling technique, a heat sink has been improved to enhance the cooling capability as disclosed in JP-A-10-294582.

In many cases, personal computers, even if they are of the same model, come with various CPU grades with different operating frequencies in order to meet users' needs and the prices are set in accordance with these grades. Thus, CPUs of the same model may have different heating values. Furthermore, in a certain distribution form, the configuration of a personal computer to be sold is changed in accordance with a user's order and the customized personal computer is shipped to the user in a short time.

In such a distribution form, it is possible to select the type and operating frequency of the CPU, the capacity of an HDD, the mounting capacity of memories, the type of a drive for removable media, and the like. The manufacturer assembles these devices into an apparatus on the basis of specifications designated by the user. Even if the user requests separate specifications for the CPU, HDD, memory module, and drive, the manufacturer may simply select and incorporate the appropriate devices into the apparatus because each device has the same outside dimensions in spite of differences in grade. Thus, the same mounting structure and main board can be used.

However, since there have been increases in the number of choices of the types or operating frequencies of the CPU and thus in the range of power consumption, it is now difficult to utilize the common cooling module for CPUs. Specifically, if the forced air cooling technique is employed in order to apply a cooling module based on the same system to all the CPUs, the size of the cooling module is disadvantageously increased because it must be adapted for the maximum value of the power consumption of the selected CPU. Furthermore, if the water cooling technique is employed to reduce the size of the cooling module, then disadvantageously the cooling module may require higher costs and may be improperly assembled.

SUMMARY OF THE INVENTION

It is an object of the present invention to use the same cooling module to provide both water cooling system and forced air cooling system in order to solve the above problems. That is, it is an object of the present invention to provide a cooling module that enables a cooling module based on the forced air cooling system to be selected if a CPU with low power consumption is used, while enabling a cooling module based on the water cooling system to be selected if a CPU with high power consumption is used.

According to the present invention, to accomplish the object, the cooling module comprises a cooling jacket thermally connected to a CPU to transmit heat generated by the CPU to a cooling liquid, a pump that circulates the cooling liquid, a reserve tank used to provide a supplementary cooling liquid, and a first radiator and a second radiator which causes the cooling liquid to radiate heat.

Moreover, the cooling jacket, pump, reserve tank, first and second radiators of the cooling module are arranged in a circulating path for the cooling liquid. The pump and the reserve tank are installed above the cooling jacket. The first radiator is installed above the pump and reserve tank. The second radiator is located at a side of the cooling jacket, pump, reserve tank, and first radiator. The second radiator is located on a downstream side of cooling winds with respect to the first radiator.

The cooling jacket cooling the CPU internally comprises a cylindrical fin in which a plurality of fins are stacked. Heat generated by the CPU is transmitted to the cylindrical fin, which then transmits the heat to the cooling liquid. Furthermore, straightening vanes are provided on some of the fins stacked in the cylindrical fin. Furthermore, each of the fins stacked in the cylindrical fin is provided with a first convex portion that forms a stacking gap and a second convex portion provided at a top of the first convex portion to position the fin.

Therefore, the present invention can provide a cooling module based on the water cooling method which can replace a cooling fin based on the forced air cooling system. This eliminates the need to employ different cooling methods for the respective CPUs. It is thus possible to use common components for the modules other than the cooling module.

Furthermore, the cooling module can be replaced with one based on the forced air cooling system. It is thus unnecessary to change the structure of the apparatus depending on the model of the personal computer.

Other objects, features and advantages of the invention will become apparent from the following description of the embodiments of the invention taken in conjunction with the accompanying drawings.

PREFERRED EMBODIMENTS OF THE INVENTION

Figure 1:
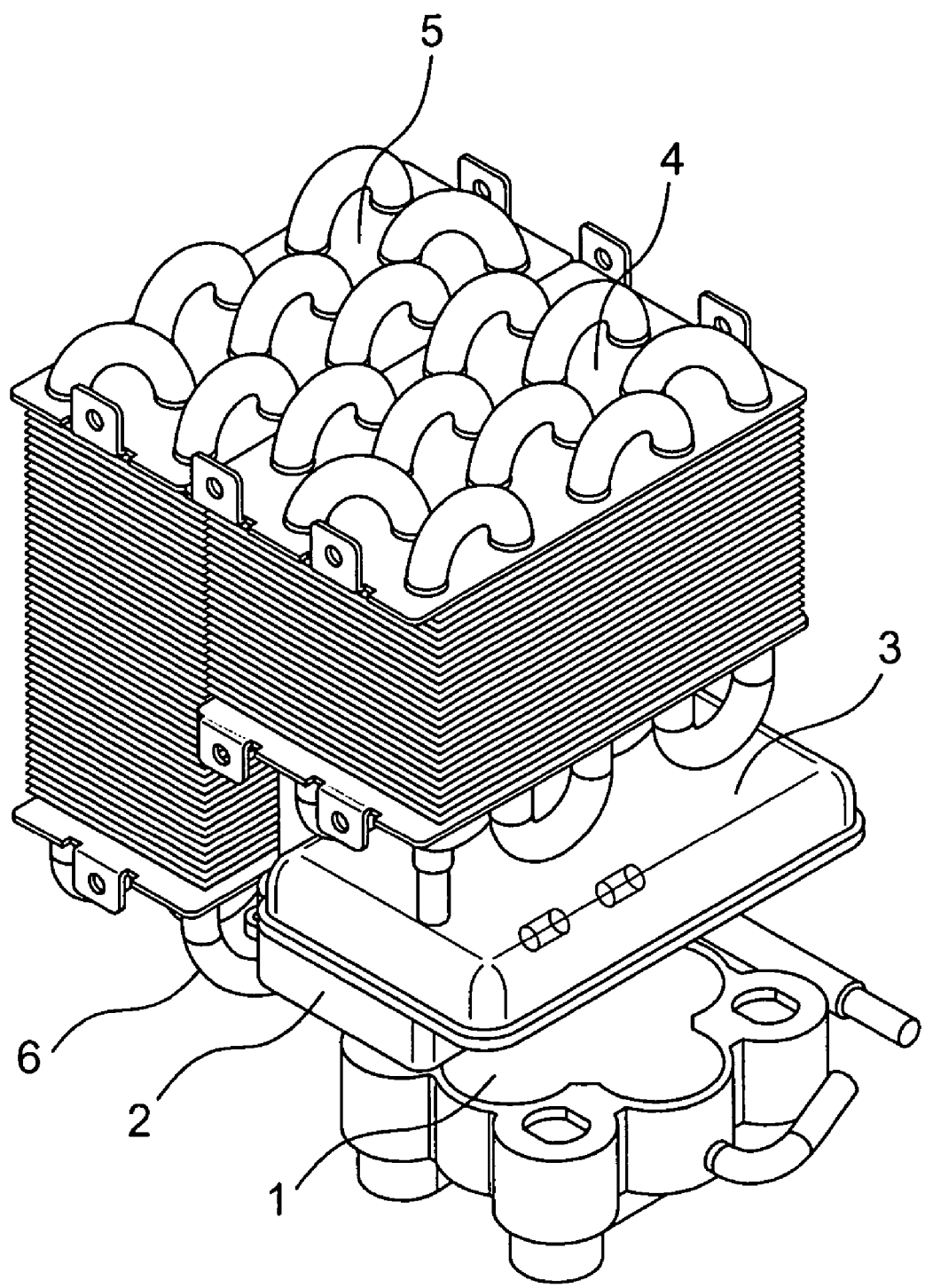
FIG. 1 is a schematic view of a cooling module according to the present invention as viewed from above.

To be also used as a cooling module based on a forced air cooling system, cooling module according to the present invention is designed so that the following components are stacked above a CPU: a cooling jacket 1 allowing a cooling liquid to absorb heat generated by the CPU, a pump 2 causing the cooling liquid to circulate, a reserve tank 3 used to provide a supplementary cooling liquid and to bleed air from the cooling liquid, and a first radiator 4 that cools the cooling liquid. The cooling module is also designed so that a second radiator 5 is located at a side of the first radiator 4 to cool the cooling liquid.

Moreover, the cooling liquid is driven by the pump 2 so as to circulate from the cooling jacket 1, which absorbs heat generated by the CPU, through the radiator 5 and radiator 4 to the reserve tank 3. On this occasion, cooling winds flow from the radiator 4 to the radiator 5.

Embodiment 1

FIG. 1 is a schematic view of the cooling module according to the present invention as viewed from above. First, the configuration of the cooling module will be described. The cooling module is designed to be mounted above the CPU of a personal computer (hereinafter referred to as a "PC" in the embodiments). The cooling module and a forced air cooling fan are designed so as to be mounted in the same mounting portion with respect to the CPU so that the cooling module can be replaced with the forced air cooling fan. Although described later in detail, the heat generated by the CPU is transmitted from a surface of a CPU package (in some cases, a CPU die chip) to a CPU heat receiving surface of the cooling module.

The cooling module in FIG. 1 is based on a liquid cooling system that receives and radiates heat by circulating a cooling liquid. The cooling module is composed of the cooling jacket 1 that causes a cooling liquid to absorb heat generated by the CPU, the pump 2 that causes the cooling liquid to circulate, the reserve tank 3 used to provide a supplementary cooling liquid and to bleed air from the cooling liquid, and a first radiator 4 that cools the cooling liquid, and the second radiator 5. These members are connected in series by tubes filled with a cooling liquid. The cooling liquid circulates through these members.

The cooling jacket 1, the pump 2, the reserve tank 3, and the radiator 4 are stacked in this order in a direction opposite to the CPU. The radiator 5 is located at the side of the stacked members so that its fin is flush with the radiator 4. The height of the radiator 5 is substantially equal to the total height of the stacked members.

A detailed description will be given of the structure of the radiator that allows a cooling liquid to radiate heat. The radiators 4 and 5 are each composed of thin plates stacked at fixed intervals. A plurality of tubes are provided so as to penetrate the fin. Moreover, the ends of the tubes are connected together above and below the radiators so that the cooling liquid flows zigzag. By employing such a structure in which the tubes are disposed so as to penetrate the radiator fin zigzag, it is possible to reduce the difference in temperature between the fins. This structure is also expected to produce a cooling effect by blowing cooling winds against the tubes.

Furthermore, the fin is composed of thinner plates than the cooling fin based on the forced air cooling system. This makes it possible to provide a larger radiating area using a volume established by a comparable external shape. Therefore, this structure can provide a more excellent cooling capability than the forced air cooling fin.

Although described later in detail, the separate radiators 4 and 5 are provided so as to share the fin, thus allowing each radiator to be composed of one type of thin plate fins.

Figure 2:
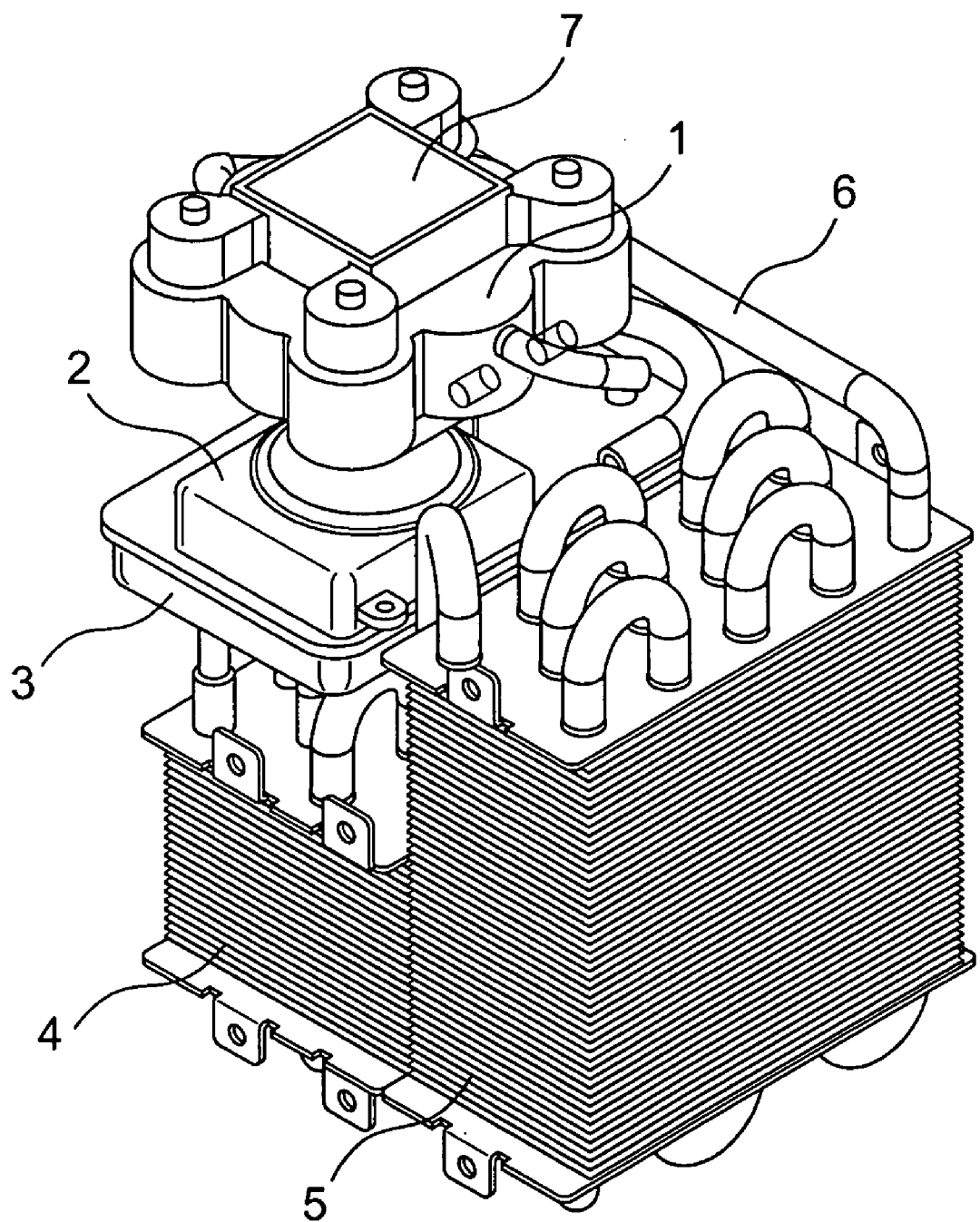
FIG. 2 is a schematic view of the cooling module according to the present invention as viewed from above.

FIG. 2 is a schematic view of the cooling module according to the present invention as viewed from below. The cooling module 1 is thermally connected to the CPU on the base via a diamond sheet 7. Diamond powders are applied on the diamond sheet. The diamond sheet is applied to the cooling module 1 to diffuse heat in the direction of a sheet surface. The diamond is generally known to have a high heat conductivity. However, it is also effectively used for a heat diffusing sheet for the cooling jacket. In particular, for CPUs in which an LSI package does not contain any heat spreaders (for example, an LSI package having an exposed CPU die chip), the diamond is required to efficiently transmit the heat generated by the CPU to the cooling module.

Alternatively, to improve the heat conductivity of the heat receiving surface of the cooling jacket, it is possible to, for example, apply a silicon grease or polish a contact surface to reduce surface roughness. Alternatively, the heat conductivity may be improved by providing set screws in the four corners of the CPU heat receiving surface of the cooling module so that the cooling module can be brought into pressure contact with the CPU.

Figure 3:
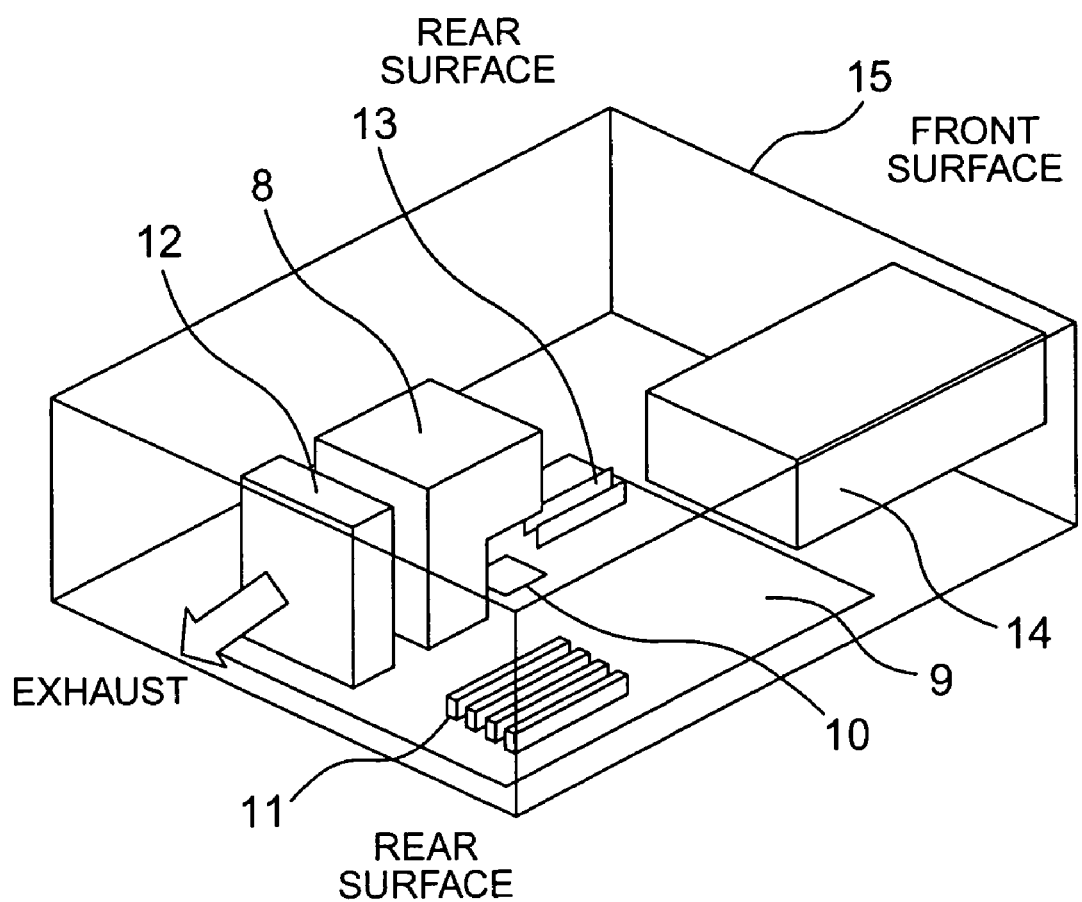
FIG. 3 is a diagram showing the configuration of a personal computer to which the cooling module is applied.

FIG. 3 is a schematic diagram showing the configuration of a PC to which the cooling module according to the present invention is applied. A PC main body 15 is composed of a base board 9 on which a CPU 10, a memory module 13, and the like are mounted, a power supply unit (not shown), a media drive 14 such as an HDD. In addition to the CPU 10 and the memory module 13, adapter connectors 11 into which various control LSIs or expansion boards are inserted and an interface connector (not shown) are mounted on the base board 9. To connect an interface cable directly to the interface connector, the base board 9 is mounted in a part of the PC main body 15 which is biased toward its rear surface. A plurality of media drives 14 (an HDD, a DVD-ROM drive, an FDD, and the like) are mounted on a front surface of the PC apparatus 15.

The height dimension of the PC main body 15 is determined on the basis of the height dimensions of the expansion boards inserted into the adapter connectors 11 and the outside dimensions of the media drives 14. For example, for a tower type PC, the height dimension is determined on the basis of the width dimensions of the media drives 14; it is generally equal to the width dimension of a 5-inch drive, that is, about 150 mm, plus a structural margin. In this case, no devices are provided above the CPU 10 of the base board 9. Accordingly, the cooling module 8 according to the present invention can be installed in this area. Furthermore, if PCI boards are inserted into the adapter connectors 11 to determine the dimensions of the apparatus, then there is a margin of about 100 mm above the base board. Thus, a cooling module 8 with a height of at least 100 mm can be installed. The cooling fan based on the forced air cooling system is mounted above the CPU 10 and can replace the cooling module 8.

More specifically, the cooling module 8 is installed above the CPU 10 so that the radiator 5 of the cooling module 8 is located closer to the rear surface of the PC main body 15. A fan 12 that cools the radiators 4 and 5 is installed further behind the cooling module 8. In this case, the fan 12 is driven to discharge hot air from the rear surface of the PC main body 15. This enables the interior of the PC main body 15 to be ventilated. It is thus possible to cool heat generating members other than the CPU 10 (for example, the memory module 13 and the media drives 14).

Figure 4:
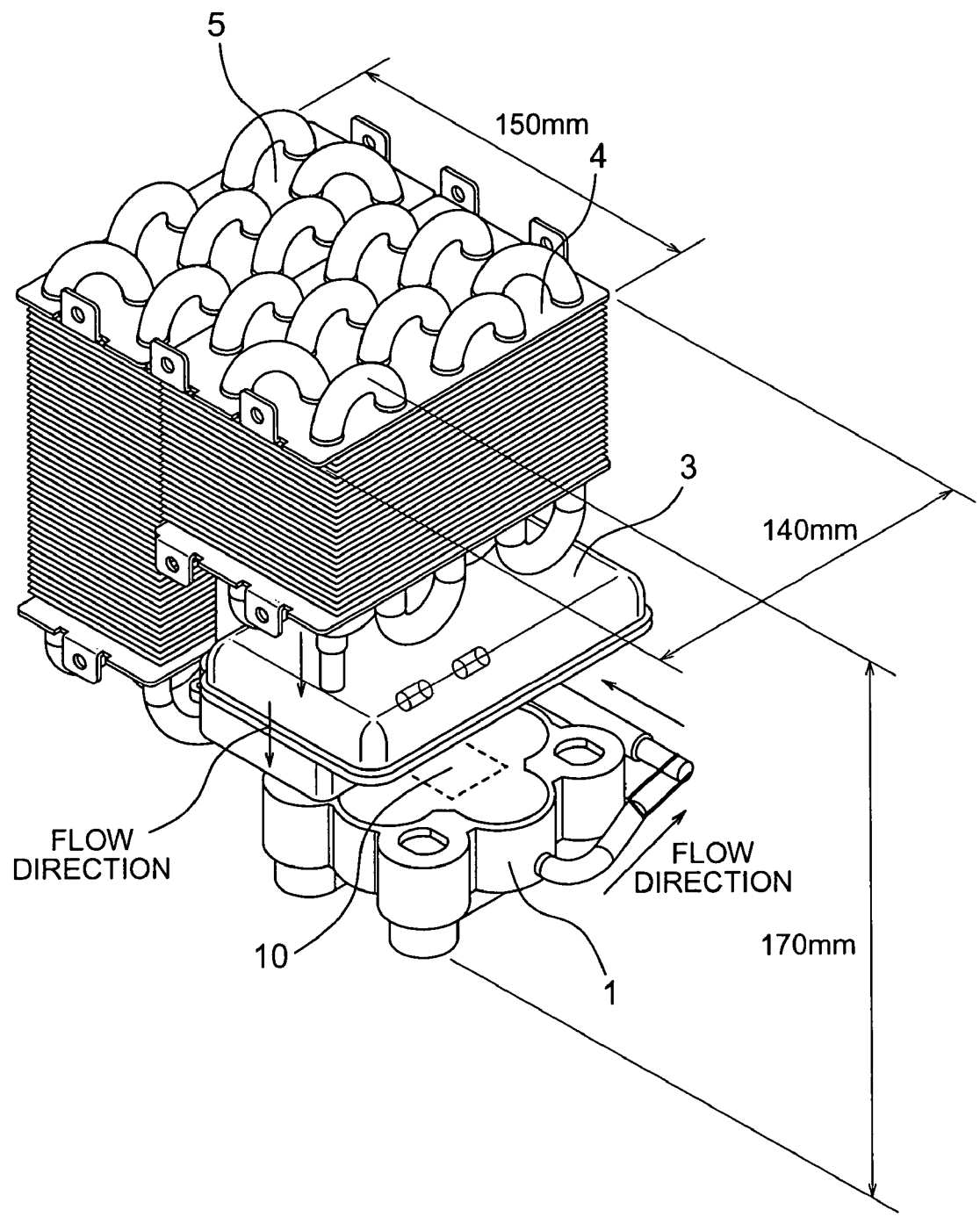
FIG. 4 is a view showing the outside dimensions of the cooling module.

FIG. 4 is a view more specifically showing the outside dimensions of the cooling module according to the present embodiment. These outside dimensions provide a radiating capacity of about 120 W and enable the cooling of a CPU that operates at a frequency of 3 G or more. A forced air cooling fin having a volume comparable to that of the cooling module in FIG. 4 has a cooling capacity of only about 70 W. Although the forced air cooling system can be adapted to execute heat radiation comparable to that achieved by the cooling module by increasing the rotation speed of the fan and thus the amount of cooling winds, noise resulting from the rotation of the fan may become louder. In contrast, if the cooling module in FIG. 4 is used for a CPU with a smaller heating value, it is possible to reduce the rotation speed of the fan 12 and thus its noise.

Figure 5:
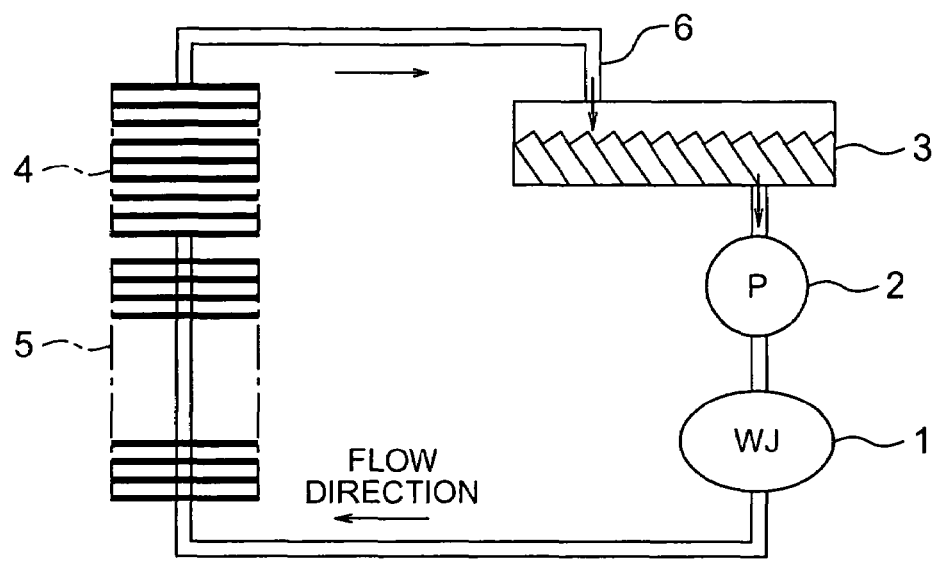
FIG. 5 is a diagram schematically showing a circulating path for a cooling liquid.

FIG. 5 is a diagram schematically showing a circulating path for a cooling liquid for the cooling module 8. The cooling liquid is circulated by the pump 2 through the circulating path in FIG. 5. The cooling liquid ejected from the pump 1 absorbs the heat generated by the CPU while passing through the cooling jacket 1. The cooling liquid is then routed through the radiators 5 and 4 in this order. In the radiators 5 and 4, the heat accumulated in the cooling liquid is transmitted to the radiator fins and thus to cooling winds from the fan. The heat is thus radiated. The cooling liquid has the highest liquid temperature at an inlet of the radiator 5. The heat is then radiated while the cooling liquid is flowing through the radiators. At an outlet of the radiator 4, the temperature of the cooling liquid returns to the value present before the heat generated by the CPU 10 is absorbed. Thus, the average temperature of the cooling liquid is higher in the radiator 5 than in the radiator 4.

The cooling liquid from the radiator 4 flows into the reserve tank 3. The reserve tank 3 is provided to compensate for the leakage of the cooling liquid from the tube 6, the radiators 4 and 5, and the like. In the present invention, the modules are configured so that the radiators 4 and 5 are close to the cooling jacket 1. Accordingly, the tube 6, through which the cooling liquid passes, is short, so that only a small amount of cooling liquid leaks. Thus, it is only necessary to provide a reserve tank with a small capacity.

The reserve tank 3 is used not only to provide a supplementary cooling liquid but also to bleed possible bubbles from the cooling liquid. Thus, the reserve tank 3 is composed of two layers, that is, a liquid layer portion and an air layer portion, so that bubbles from the cooling liquid are collected in the air layer portion. The cooling liquid is ejected from the reserve tank 3 through the liquid layer portion. Thus, a cooling liquid sucking port and a cooling liquid ejecting port of the reserve tank 3 must be adjusted depending on the direction in which the cooling module is installed.

If the base board 9 is a horizontal plane as shown in FIG. 3, the CPU 10 is also installed to extend in a horizontal direction. The cooling liquid sucking port of the reserve tank 6, provided above the CPU 10, is formed in an upper part of the reserve tank 3. The cooling liquid ejecting port is formed in a lower part of the reserve tank 6. Alternatively, the base board 9 may be installed so as to form a vertical plane. In this case, the CPU 10 is also installed so as to form a vertical plane. Accordingly, the cooling liquid sucking port of the reserve tank 6, provided above the CPU 10, must be formed in a vertically upper part of the reserve tank 3. The cooling liquid ejecting port must be formed in a vertically lower part of the reserve tank.

Figure 6:
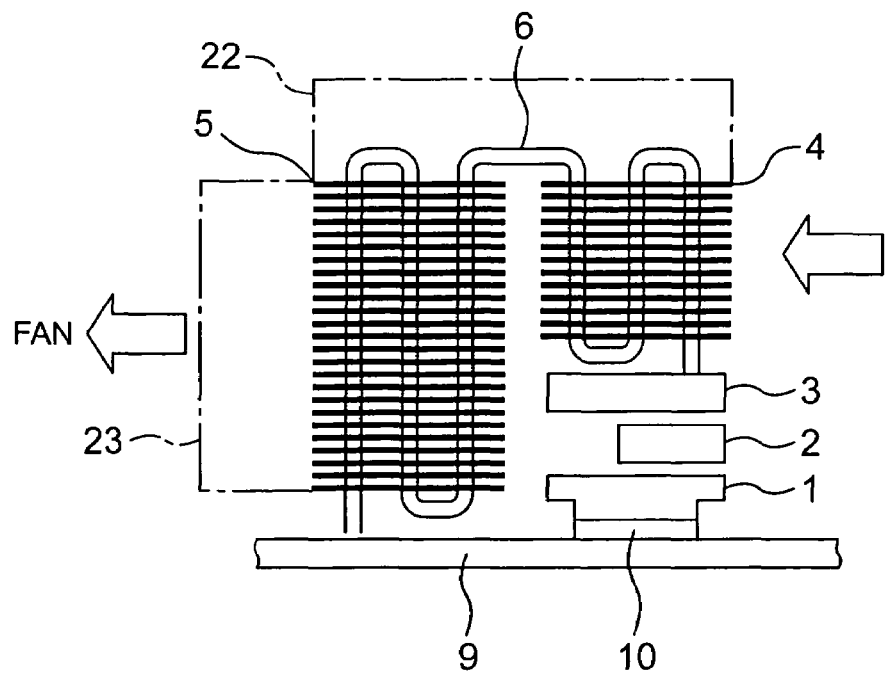
FIG. 6 is a diagram schematically showing the configuration of the cooling module.

FIG. 6 is a sectional view of a substrate of the cooling module according to the present invention as well as a perpendicular plane. The cooling jacket 1 of the cooling module is thermally connected to the CPU 10, which is a heat generating member mounted on the base board 9 as previously described. The pump 2 and the reserve tank 3 are installed above the cooling jacket 1. The radiator 4 is further installed above the pump 2 and reserve tank 3. The radiator 5 is located at the side of the stacked cooling jacket 1, pump 2, reserve tank 3, and radiator 4.

Cooling winds that cool the radiators 4 and 5 are generated by sucked in by a fan located on a side of the radiator 5 which is opposite the radiator 4. The cooling winds flow among the radiator fins in order of the radiators 4 and 5 to cool the fins. As described in FIG. 5, the average temperature of the radiator 5 is higher than that of the radiator 4. Furthermore, in the radiator, heat is transmitted owing to the difference in temperature between the radiator fin and the cooling winds. Thus, if the cooling winds absorb the heat until their temperature reach the average temperature of the radiator 4, heat is still radiated from the radiator fin in the radiator 5 because the average temperature of the radiator 5 is higher than that of the radiator 4, so that in the radiator 5, the radiator is hotter than the cooling winds. In this manner, heat can be efficiently radiated by providing the hot radiator on the lee side of the cooling winds.

Moreover, since the cooling winds flow among the radiator fins in the radiators 4 and 5, the radiator fins of the radiators 4 and 5 are desirably arranged on the same plane. This arrangement serves to reduce the flow resistance of the cooling winds.

Furthermore, the radiator 5 has a larger radiating area than the radiator 4 because its total height. Heat can be efficiently radiated by allowing cooling winds to flow over the range equal to the total height of the radiator. The fan 12 is advantageously provided on the side of the radiator 5 which is opposite the radiator 4 because no obstacles that block the cooling winds are present between the fan 12 and the radiator 5.

The radiating capacity of the radiator is proportional to the radiating area of the radiator fin and can thus be adjusted by increasing the number of fins stacked up to 22. As described in FIG. 3, the area above the cooling module is not a cavity in which devices are mounted. Accordingly, the radiating capacity of the radiator can be easily adjusted within the range of the dimensions of the PC main body 15. In this case, in order to correspondingly increase the range of the cooling winds, it is desirable to increase the diameter of the fan 12. It should be appreciated that the number of radiator fins stacked may be reduced in order to lessen the radiating capacity.

Furthermore, the radiating capacity of the radiator 5 can be enhanced by increasing the area of the radiating fins up to 23. The radiating capacity of the radiator 5 may also be enhanced by increasing both the number of fins stacked and the area of the fins. In any case, the radiating capacity can be easily adjusted by changing the number of fins stacked or the area of the fins.

In the description of FIGS. 1 and 6 and other figures, the L-shaped radiator fin is constructed by appropriately arranging the radiators 4 and 5. However, even if the L-shaped radiator fin is constructed by stacking fins of different sizes in the vertical direction, the radiating capacity can be easily adjusted by changing the number of fins stacked or the area of the fins. However, in this case, two types of fins are required, and it is thus impossible to obtain the benefit of reducing the number of parts required by sharing certain parts.

Figure 7:
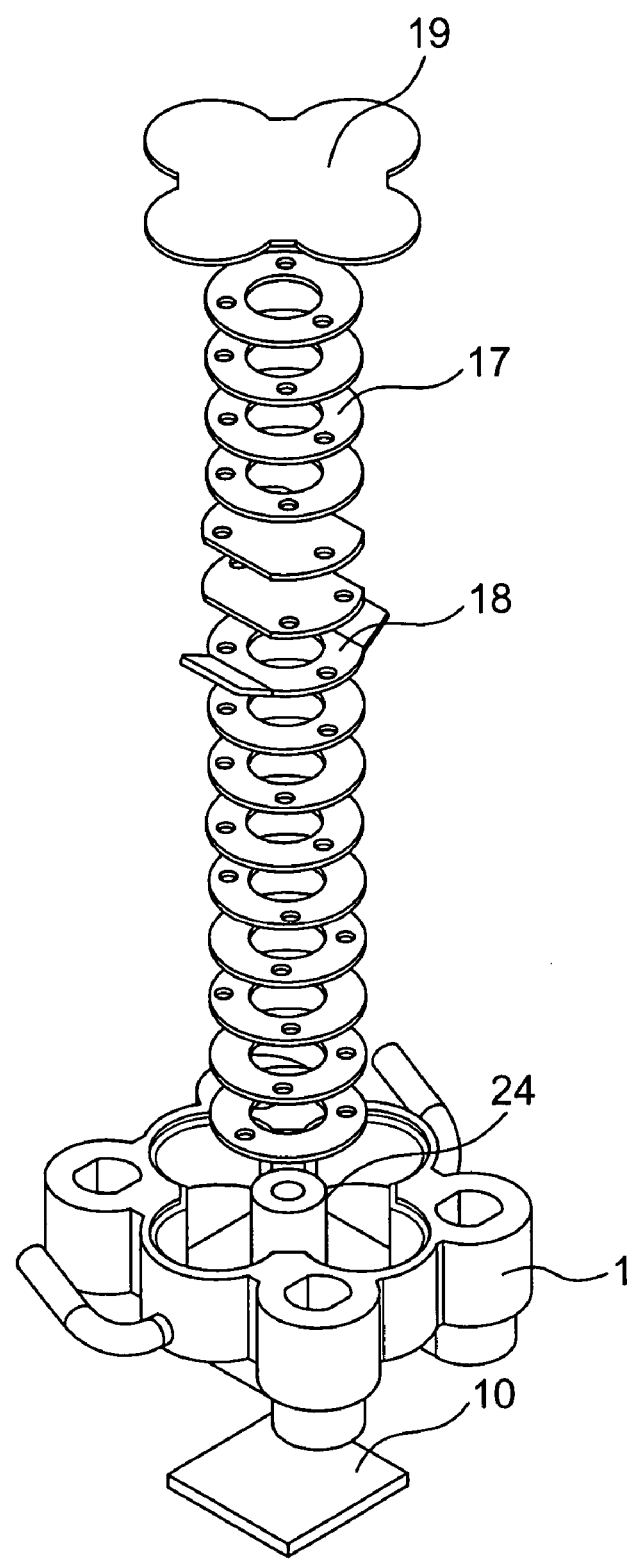
FIG. 7 is a view showing how a jacket of the cooling module is assembled.

FIG. 7 is a view showing how the cooling jacket of the cooling module is assembled. The cooling jacket is composed of a jacket casing 1, jacket fins 17, and a jacket cover 19 and is thermally connected to the CPU 10 below the casing 1. The jacket fins 17 are inserted over a cylindrical portion 24 provided in a central portion of the jacket casing 1 so that a gap is created between the fins 17. A cylindrical fin is thus formed. In this case, although not described in detail, the cylindrical fan includes a number of fins 18 shaped differently from the jacket fins 17 owing to the provision of a straitening vane.

A cooling liquid is filled into the casing 1. Heat generated by the CPU, received on the base of the casing 1, is transmitted to the plurality of jacket fins 17 via the cylindrical portion 24. The heat is then transmitted from the jacket fins 17 to the cooling liquid. The jacket cover 19 prevents the cooling liquid from leaking from the jacket casing 1. The cooling liquid is sucked from one end of the jacket casing 1 and ejected from the other end. Since the cooling liquid moves into and out of the jacket casing 1, the heat can be radiated from the CPU 10 via the jacket fins 17.

The jacket fins 17 are each composed of a copper plate having a high heat conductivity. The jacket fins 17 are inserted into the cylindrical portion 24 and then brazed. A method of fixing the jacket fins 17 is not limited to brazing. It is allowable to use a manufacturing method based on the press-in of the fins or to insert and then expand and caulk the fins. The radiators 4 and 5 can be similarly manufactured.

Figure 8:
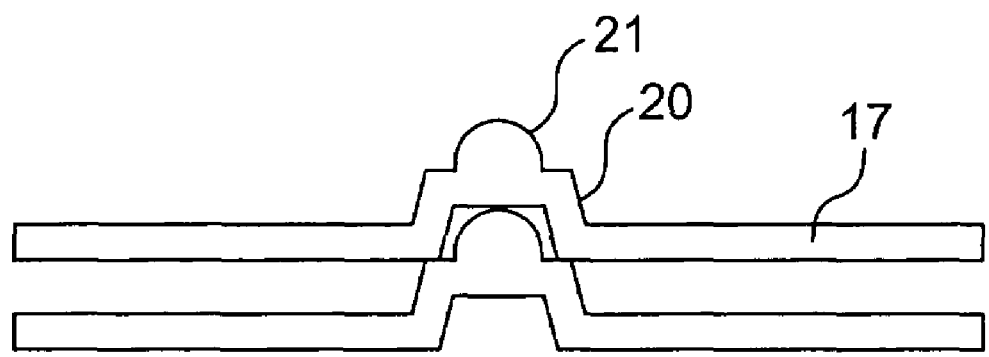
FIG. 8 is a sectional view of a jacket fin.
Figure 9A:
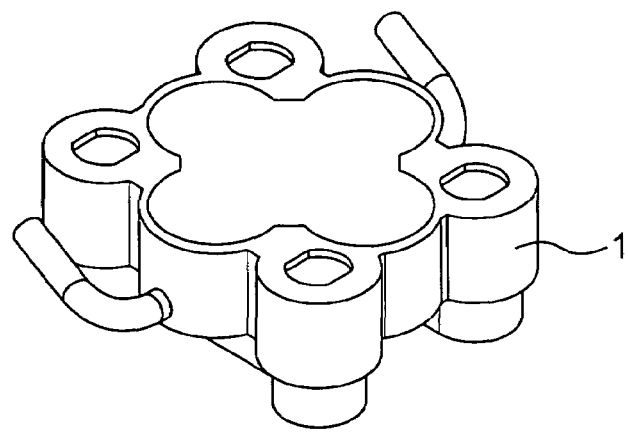
FIG. 9 is a view showing the configuration of a jacket casing.
Figure 9B:
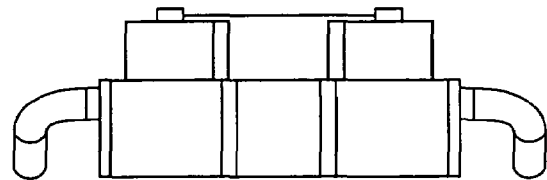
Figure 9C:
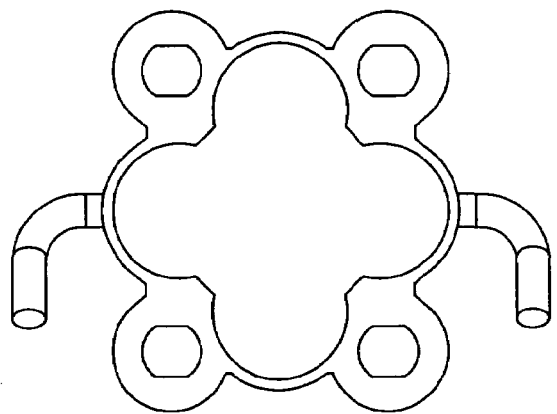
Figure 9D:
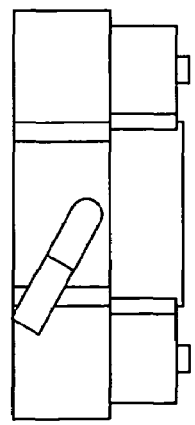

FIG. 8 is a sectional view of a botch portion of the jacket fins, which are installed so as to have a gap between them. A first convex portion 20 and a second convex portion 21 are provided on each jacket fin by an extrusion method. In this case, the projecting portion of the first convex portion 20 has a sectional shape different from that of its recessed portion so that when the jacket fins are stacked, a gap is created between the fins in the direction of their height. The second convex portion 21 is provided on the top of the first convex portion 20 and is shaped so as to hide in the recessed portion of the first convex portion 20. This enables the jacket fins to be stacked so as to create a specified gap between them through which the cooling liquid can flow. It is further possible to hinder the fins from rotating. Since the jacket fins are hindered from rotating, the step of brazing the jacket fins can be smoothly executed. This is particularly effective in positioning the jacket fins 18, each having the straightening vane, described later.

FIG. 9 is a view showing the configuration of the jacket casing 1. FIG. 9A is a schematic view. FIG. 9B is a central sectional view. FIG. 9C is a transverse sectional view. FIG. 9D is a side view. A cooling liquid input port and a cooling liquid output port are formed in the left and right, respectively, of the casing as shown in FIG. 9C. A cooling liquid flows into the casing and through a central portion of the casing, in which the previously described jacket fins are provided, and is then discharged from the output port. A mounting portion is formed in each of the four corners of the jacket casing 1 to allow the jacket casing 1 to be mounted on the CPU. The casing 1 is connected to the CPU at its bottom and is formed of a material with a high heat conductivity enough to transmit heat generated by the CPU to the cooling liquid. The appropriate material is, for example, aluminum or copper. In particular, the casing can be efficiently manufactured using aluminum and a die cast manufacturing method.

Figure 10:
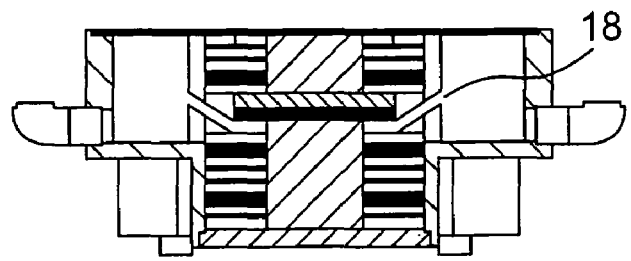
FIG. 10 is a sectional view of the cooling jacket.
Figure 11:
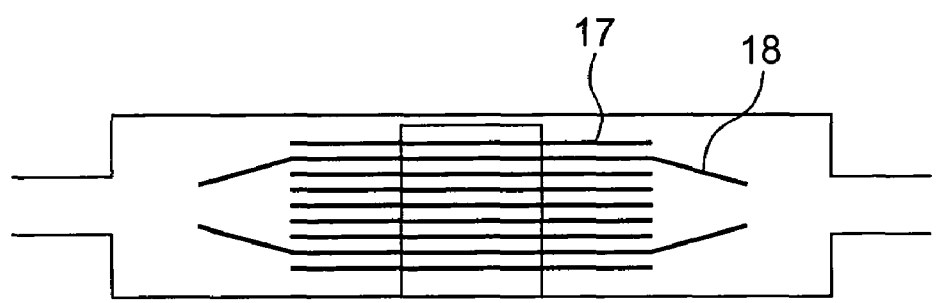
FIG. 11 is a diagram illustrating another cooling jacket fin (1)
Figure 12:
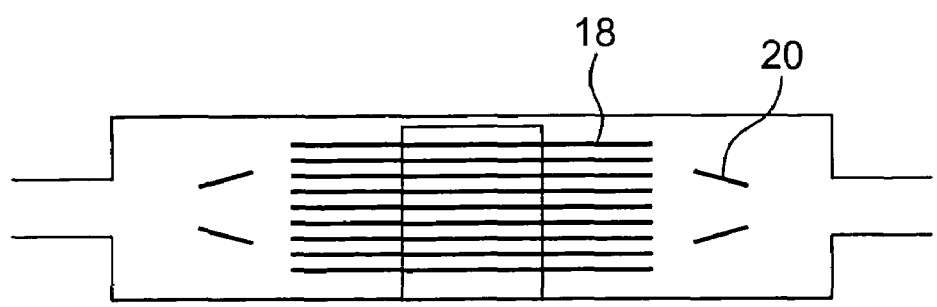
FIG. 12 is a diagram illustrating another cooling jacket fin (2).

FIG. 10 is a diagram showing a cross section of the cooling jacket 1. The previously described jacket fins are arranged in a central portion of the cooling jacket 1. Accordingly, heat generated by the CPU thermally connected to the cooling jacket at its bottom is transmitted to the jacket fins. A cooling liquid cooling the jacket fins is injected into or ejected from the cooling jacket through either of the opposite ends of the jacket fins. In order to transmit the heat generated by the CPU to the cooling liquid, it is necessary to make the total height of the jacket fins larger than the diameter of a circulating tube for the cooling liquid even if the previously described cylindrical fin is used. Thus, the cooling liquid does not flow among the jacket fins uniformly, resulting in the distribution of heat release. According to the present invention, to prevent this problem, straightening vanes are provided so as to provide a uniform flow of cooling liquid in the height direction of the jacket fins in the cylinder. FIG. 10 shows an example in which a fin 18 having straightening vanes formed by extending the jacket fin is provided. FIG. 11 shows a cylindrical fin in which jacket fins having two types of straightening vanes extending in different directions are stacked in order to disperse a cooling liquid in the vertical direction, the cooling liquid flowing into the central portion of the radiator fins. In this case, the fins having the two types of straightening vanes are combined with the ordinary fins, thus increasing costs. Thus, the straightening vales may be inserted into the cooling jacket as separate parts as shown in FIG. 12.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A cooling module for a CPU mounted in an information processing apparatus, the module comprising:
 a cooling jacket thermally connected to the CPU to transmit heat generated by the CPU to a cooling liquid;
 a pump that circulates the cooling liquid;
 a reserve tank used to provide a supplementary cooling liquid; and
 a first radiator and a second radiator which cause the cooling liquid to radiate heat,
 wherein the cooling jacket, the pump, the reserve tank, the first and second radiators are arranged in a circulating path for the cooling liquid,
 the pump and the reserve tank are installed above the cooling jacket, and the first radiator is installed above the pump and reserve tank, and
 the second radiator is located at a side of the cooling jacket, pump, reserve tank, and first radiator.

2. The cooling module according to claim 1, wherein a radiating fin in the first radiator and a radiating fin in the second radiator are provided on the same plane.

3. The cooling module according to claim 1, wherein the second radiator is located closer to the cooling jacket than the first radiator and on an upstream side of the circulating path with respect to the first radiator.

4. The cooling module according to claim 1, wherein cooling winds are blown through the first radiator and then the second radiator.

5. The cooling module according to claim 1, wherein the cooling liquid circulates through the pump, the cooling jacket, the second radiator, the first radiator, and the reserve tank in this order.

* * * * *